United States Patent
Giusti et al.

(10) Patent No.: US 10,175,474 B2
(45) Date of Patent: Jan. 8, 2019

(54) MICROMECHANICAL DEVICE HAVING A STRUCTURE TILTABLE BY A QUASI-STATIC PIEZOELECTRIC ACTUATION

(71) Applicant: STMicroelectronics S.r.l., Agrate Brianza (IT)

(72) Inventors: Domenico Giusti, Monza (IT); Roberto Carminati, Piancogno (IT); Massimiliano Merli, Stradella (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 71 days.

(21) Appl. No.: 15/165,547

(22) Filed: May 26, 2016

(65) Prior Publication Data
US 2017/0160540 A1    Jun. 8, 2017

(30) Foreign Application Priority Data
Dec. 7, 2015    (IT) .................. 102015000080884

(51) Int. Cl.
*G02B 26/08*    (2006.01)
*G02B 26/10*    (2006.01)
(Continued)

(52) U.S. Cl.
CPC .......... *G02B 26/105* (2013.01); *B81B 3/0048* (2013.01); *B81B 3/0083* (2013.01);
(Continued)

(58) Field of Classification Search
CPC ...... G02B 26/01; G02B 26/105; G02B 26/08; G02B 26/0858; B81B 3/0021; B81B 3/0083; H04N 9/3173
(Continued)

(56) References Cited

U.S. PATENT DOCUMENTS

2006/0018049 A1*    1/2006    Mizuno .............. G02B 26/0841
                                                                      359/871
2006/0072224 A1*    4/2006    Levitan ................ G02B 26/101
                                                                      359/872
(Continued)

FOREIGN PATENT DOCUMENTS

EP    2749526 A1    7/2014
EP    2811331 A1    12/2014
(Continued)

OTHER PUBLICATIONS

IT Search Report and Written Opinion for IT 102015000080884 dated Jul. 14, 2016 (6 pages).
(Continued)

*Primary Examiner* — Euncha Cherry
(74) *Attorney, Agent, or Firm* — Crowe & Dunlevy

(57) ABSTRACT

A micromechanical device includes a tiltable structure that is rotatable about a first rotation axis. The tiltable structure is coupled to a fixed structure through an actuation structure of a piezoelectric type. The actuation structure is formed by spring elements having a spiral shape. The spring elements each include actuation arms extending transversely to the first rotation axis. Each actuation arm carries a respective piezoelectric band of piezoelectric material. The actuation arms are divided into two sets with the piezoelectric bands thereof biased in phase opposition to obtain rotation in opposite directions of the tiltable structure about the first rotation axis.

19 Claims, 5 Drawing Sheets

(51) Int. Cl.
*B81B 3/00* (2006.01)
*H04N 9/31* (2006.01)

(52) U.S. Cl.
CPC ....... *G02B 26/0858* (2013.01); *H04N 9/3173* (2013.01); *B81B 2201/042* (2013.01)

(58) Field of Classification Search
USPC ..................................................... 359/200.8
See application file for complete search history.

(56) References Cited

U.S. PATENT DOCUMENTS

2011/0292479 A1 12/2011 Hiraoka et al.
2014/0198366 A1 7/2014 Carminati et al.

FOREIGN PATENT DOCUMENTS

EP 2924489 A1 9/2015
JP 4926596 B2 5/2012

OTHER PUBLICATIONS

"Stanley Electric Develops Own Miniature Micromirror Projector," http://www.aboutprojectors.com/news/2007/01/26/stanley-electric-develops-own-miniature-micromirror-projector/, Jan. 26, 2007 (1 page).
Freeman, Mark et al: "Scanned Laser Pico-Projectors: Seeing the Big Picture (with a Small Device)," OPN, www.osa-opn.org, May 2009 (7 pages).

\* cited by examiner

MICROMECHANICAL DEVICE HAVING A STRUCTURE TILTABLE BY A QUASI-STATIC PIEZOELECTRIC ACTUATION

PRIORITY CLAIM

This application claims priority from Italian Application for Patent No. 102015000080884 filed Dec. 7, 2015, the disclosure of which is incorporated by reference.

TECHNICAL FIELD

The present invention relates to a micromechanical device having a structure tiltable by a quasi-static piezoelectric actuation. In particular, reference will be made hereinafter to a micromirror obtained in MEMS (Micro-Electro-Mechanical System) technology, without this implying any loss of generality.

BACKGROUND

Micromechanical devices are known having a mirror structure obtained with the technology of semiconductor materials.

These micromechanical devices are used in portable apparatus, such as for example portable computers, laptops, notebooks (including ultra-thin notebooks), PDAs, tablets, cellphones, and smartphones, for optical applications, in particular for directing light beams generated by a light source, as desired.

By virtue of their reduced dimensions, these devices are able to meet stringent requirements as regards bulk, as to area and thickness.

For example, micromechanical mirror devices are used in miniaturized projector modules (the so-called pico-projectors), which are able to project images at a distance or to generate desired patterns of light.

In combination with an image-capture module, a projector module of this kind makes it possible, for example, to produce a three-dimensional (3D) photo or video camera for obtaining three-dimensional images.

Micromechanical mirror devices generally include a mirror element suspended over a cavity and manufactured from a body of semiconductor material so to be mobile, for example with a tilting or rotation movement, for directing the incident light beam in any desired way.

For example, FIG. 1 schematically shows a pico-projector 9 comprising a light source 1, typically a laser source, generating a light beam 2 made of three monochromatic beams, one for each base color, which, through an optical system 3 represented only schematically, is deflected by a mirror element 5 in the direction of a screen 6. In the example shown, the mirror element 5 is of a two-dimensional type, driven so as to rotate about a vertical axis A and a horizontal axis B. Rotation of the mirror element 5 about the vertical axis A generates a fast horizontal scan, as shown in FIG. 2. Rotation of the mirror element 5 about the horizontal axis B, perpendicular to the vertical axis A, generates a slow vertical scan, typically of a sawtooth type. The scan scheme obtained is shown in FIG. 2 and designated by 7.

Rotation of the mirror element 5 is driven via an actuation system, which is currently of an electrostatic, magnetic, or piezoelectric type.

For example, FIG. 3 shows a mirror element 5 with a purely electrostatic actuation. Here, a chip 10 comprises a platform 11 suspended over a substrate (not visible), having a reflecting surface (not shown), and supported by a suspended frame 13 through a first pair of arms 12 (first torsion springs). The first arms 12 extend on opposite sides of the platform 11 and define the rotation axis A of the mirror element 5. The suspended frame 13 is connected to a fixed peripheral portion 15 of the chip 10 via a second pair of arms 16 (second torsion springs), which enable rotation of the suspended frame 13 and the platform 11 about the horizontal axis B. The first and second arms 12, 16 are coupled to respective actuation assemblies 18A, 18B of an electrostatic type. Each actuation assembly 18A, 18B here comprises first electrodes 19 facing respective second electrodes 20.

In detail, the first electrodes 19 are fixed with respect to the respective arms 12, 16 and are combfingered with the second electrodes 20 for generating a capacitive coupling. By virtue of the arrangement of the electrodes 19, 20 of each actuation assembly 18A, 18B, the drive structure is also defined as "comb drive structure".

By applying appropriate voltages between the first electrodes 19 and the second electrodes 20, it is possible to generate attraction/repulsion forces between them and thus cause rotation of the first electrodes 19 with respect to the second electrodes 20 and torsion of the arms 12, 16 about the respective axes A, B. In this way, controlled rotation of the platform 11 about axes A, B is obtained, and thus scanning in the horizontal direction and in the vertical direction.

Rotation of the mirror element 5 about the vertical axis A that produces horizontal scanning is obtained with an angle generally of ±12° in a resonating way at 25 kHz, and rotation of the mirror element 5 about the horizontal axis B that produces vertical scanning is generally obtained with an angle of ±8° at 60 Hz, suitable for the frame rate of video signals. As mentioned, due to the lower vertical scanning rate, it may be driven in a quasi-static, non resonant, way.

It has already been proposed to control the scanning movement about at least the horizontal axis B in a piezoelectric way. For example, in the device described in United States Patent Application Publication No. 2011/0292479, the suspended frame is connected to the fixed structure via spring elements having a coil shape formed by a plurality of arms that are mutually parallel and arranged along each other. Each arm carries a piezoelectric band, and adjacent piezoelectric bands are biased at opposite polarity voltages (for example, ±20 V). Due to the characteristics of piezoelectric materials, this biasing causes deformation in opposite directions (upwards and downwards) of adjacent arms and rotation of the frame and the platform in a first direction about the horizontal axis B. By applying an opposite biasing, rotation of the frame and of the platform in a second direction, opposite to the first, is obtained. Vertical scanning may thus be obtained by applying alternating bipolar voltages to the arms. A similar actuation system here controls also horizontal scanning.

Application of alternating bipolar voltages reduces, however, the service life of the mirror element 5.

There is a need in the art to provide a micromechanical device with piezoelectric actuation that overcomes the drawbacks of the prior art.

SUMMARY

In an embodiment, a micromechanical device comprises: a tiltable structure rotatable about a first rotation axis; a fixed structure; and an actuation structure of a piezoelectric type coupled between the tiltable structure and the fixed structure, wherein the actuation structure comprises a spring element having a spiral shape.

In an embodiment, a pico-projector for use with a portable electronic apparatus comprises: a light source configured to generate a light beam as a function of an image to be generated; a micromechanical device comprising: a tiltable structure rotatable about a first rotation axis; a fixed structure; and an actuation structure of a piezoelectric type coupled between the tiltable structure and the fixed structure, wherein the actuation structure comprises a spring element having a spiral shape; and a driving circuit configured to supply driving signals to rotate said tiltable structure.

In an embodiment, a method for actuation of a micromechanical device comprising: an tiltable structure rotatable about a first rotation axis; a fixed structure; an actuation structure coupled between the tiltable structure and the fixed structure, the actuation structure comprising a spring element having a spiral shape, the spring element being formed by a plurality of actuation arms extending in transversely to the first rotation axis, each actuation arm carrying a respective piezoelectric band of piezoelectric material, the plurality of actuation arms including a first set of actuation arms and a second set of actuation arms, wherein the piezoelectric bands on the actuation arms of the first set of actuation arms are electrically coupled to each other, wherein the piezoelectric bands on the actuation arms of the second set of actuation arms are electrically coupled to each other, comprising: applying a first voltage to the piezoelectric bands on the actuation arms of the first set of actuation arms; and applying a second voltage to the piezoelectric bands on the actuation arms of the second set of actuation arms; wherein the first and second voltages are in phase opposition with respect to each other.

BRIEF DESCRIPTION OF THE DRAWINGS

For a better understanding of the present invention, a preferred embodiment thereof is now described, purely by way of non-limiting example, with reference to the attached drawings, wherein.

DETAILED DESCRIPTION

Figure 1:
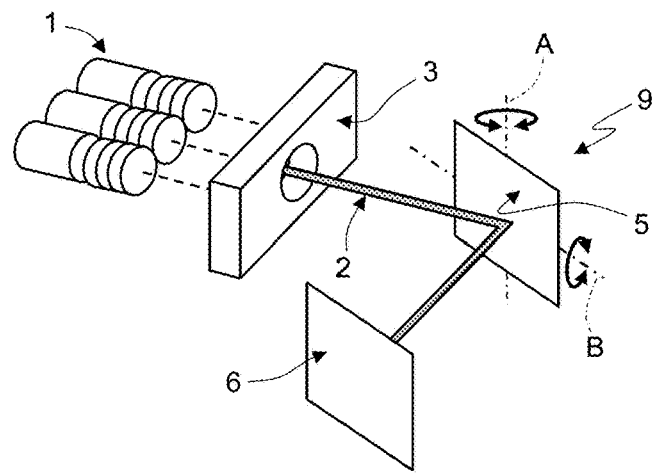
FIG. 1 is a schematic representation of a pico-projector.
Figure 2:
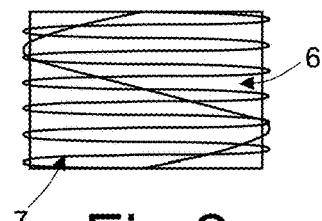
FIG. 2 shows the projection scheme of an image generated by the pico-projector of FIG. 1 on a screen.
Figure 3:
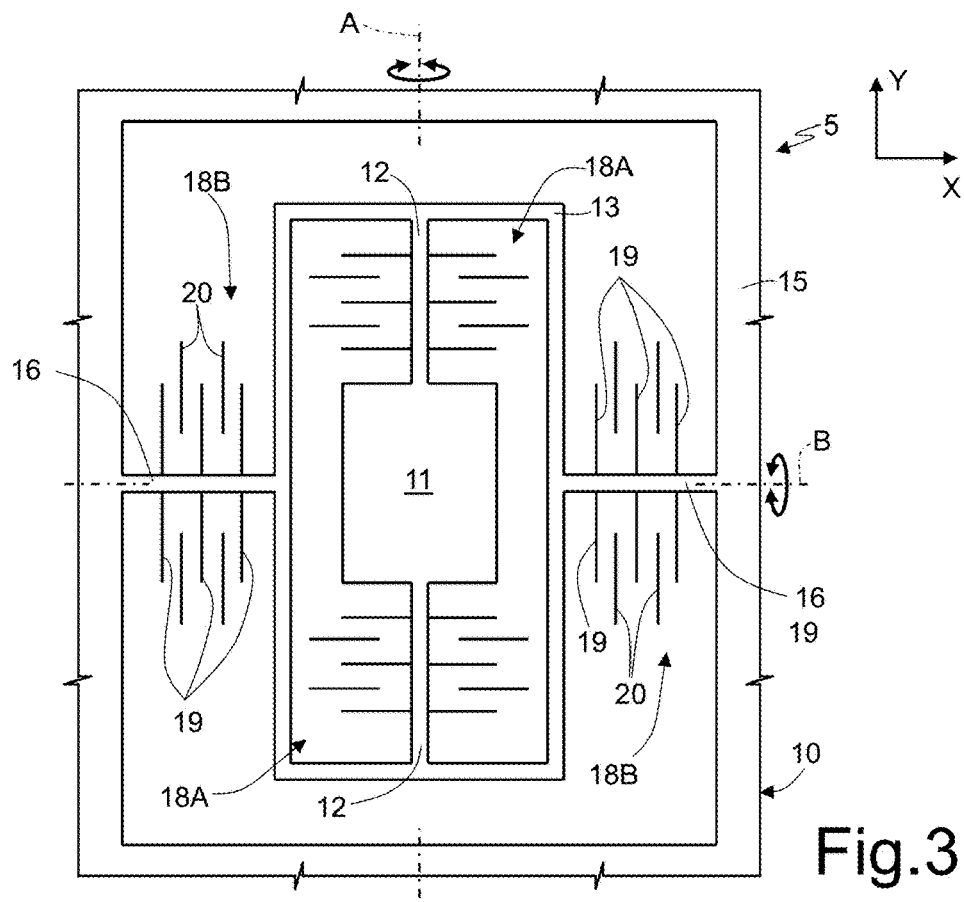
FIG. 3 is a top plan view of a microelectronic micromirror device with electrostatic actuation.
Figure 4A:
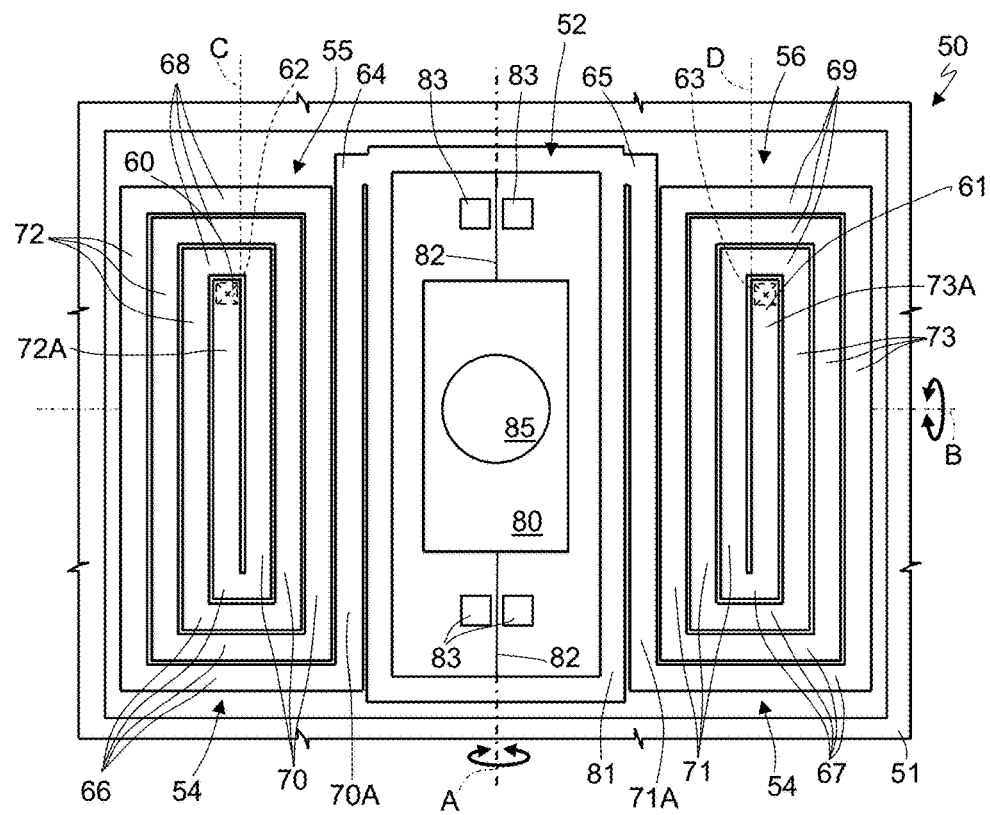
FIG. 4A is a simplified top plan view, with portions removed for clarity of representation, of an embodiment of the microelectronic micromirror device.
Figure 4C:
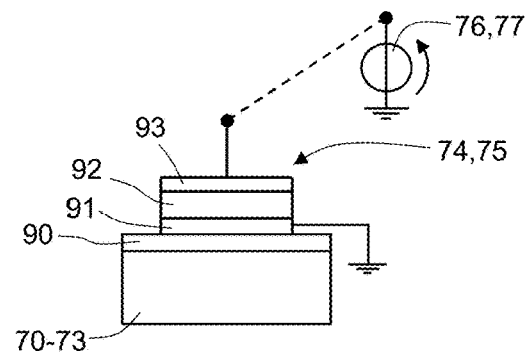
FIG. 4C is a cross-section taken along section plane IV-IV of FIG. 4B.
Figure 5:
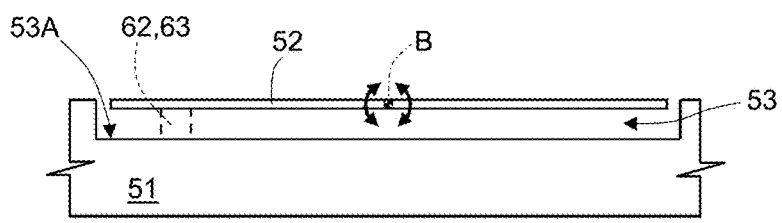
FIG. 5 is a cross-section of the microelectronic micromirror device of FIGS. 4A and 4B.
Figure 4B:
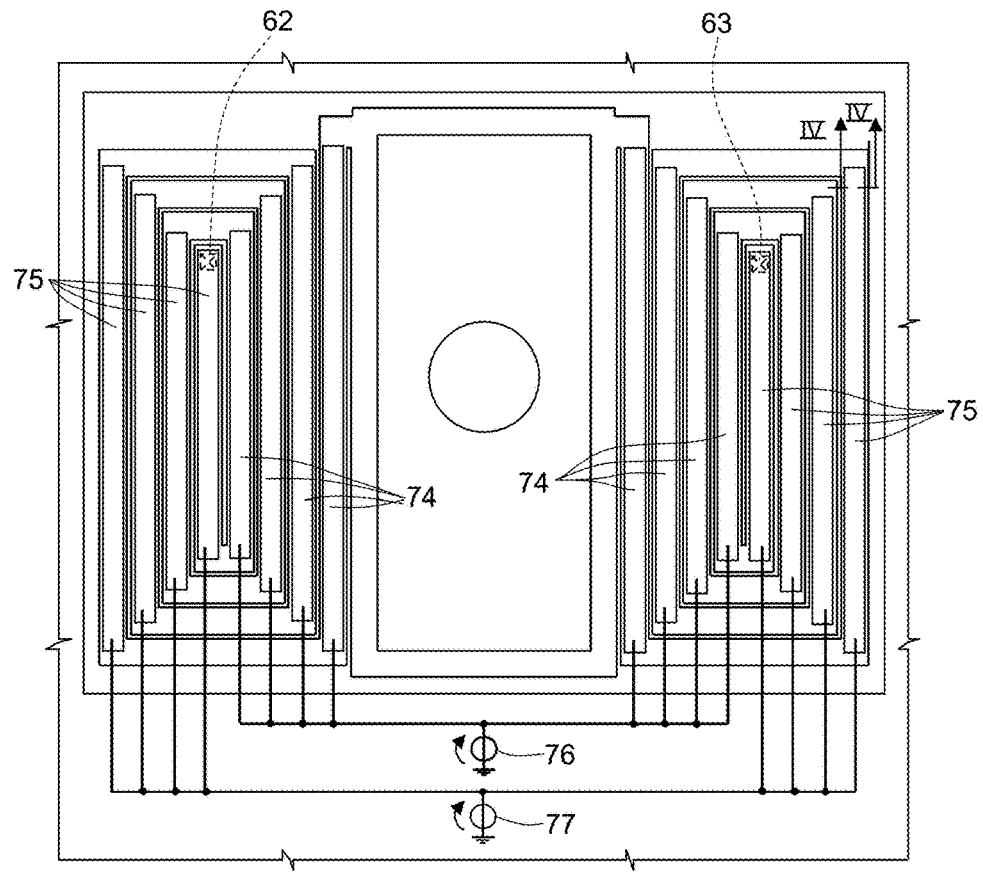
FIG. 4B is a top plan view of the microelectronic micromirror device of FIG. 4A.

FIGS. 4A, 4B, and 5 are schematic illustrations of a microelectronic device 50 having a rotating or tiltable structure 52, which is able to rotate about a first rotation axis B. As visible in FIG. 5, the tiltable structure 52 is suspended over a cavity 53 that has a bottom surface 53A, formed by a fixed structure 51. The fixed structure 51 thus extends underneath the cavity 53 and laterally with respect thereto. The fixed structure 51 and the tiltable structure 52 are manufactured from a chip of semiconductor material, for example silicon, using known semiconductor manufacturing techniques, such as etching, growth, deposition, and/or selective removal, in a per se known manner.

The tiltable structure 52 here has a quadrangular shape, in particular a rectangular shape, and is supported by the fixed structure 51 through a supporting and actuation structure 54. The supporting and actuation structure 54 comprises a first spring element 55 and a second spring element 56, arranged laterally with respect to the tiltable structure 52, in particular on opposite sides thereof, crossed by the first rotation axis B.

As is evident in particular from FIG. 4A, the spring elements 55, 56 have a spiral shape and each has a respective first end 60, 61 and a respective second end 64, 65. The first ends 60, 61 of the spring elements 55, 56 are internal to the spiral shape and are anchored to the bottom 53A of the cavity 53 by anchorage elements 62, 63 extending through the cavity 53 between the bottom 53A thereof and the tiltable structure 52, perpendicular thereto (as visible in FIG. 5). The second ends 64, 65 of the spring elements 55, 56 are external to the spiral shape and are fixed with respect to the tiltable structure 52. In the embodiment shown, the first ends 60, 61 and the second ends 64, 65 of the spring elements 55, 56 are offset with respect to the first rotation axis B, on a same side thereof.

The spring elements 55, 56 are formed by a plurality of respective first arms 70, 71 and by a plurality of respective second arms 72, 73, parallel to each other and extending in a transverse, in particular perpendicular, direction to the first rotation axis B. For each of the spring elements 55 and 56, the first arms 70 and 71 are located between the tiltable structure 52 and a respective median plane C, D of the spring elements 55, 56, perpendicular to the first rotation axis B. The second arms 72, 73 extend on the opposite side with respect to the respective median plane C, D of the spring elements 55, 56.

Moving along the spiral shape of the spring elements 55, 56 starting from their first end 60, 61, the innermost arm of each spiral shape is formed by a second arm 72, 73 (here designated by 72A, 73A) anchored to the respective anchorage element 62, 63.

Going along the spiral shape of the spring elements 55, 56 from their first end 60, 61, each first arm 70, 71 is connected to a previous second arm 72, 73 (or to the second arm 72A, 73A) via a respective first spring portion 66, 67 extending perpendicular to the first and second arms 70-73, on an opposite side to the respective anchorage element 62 and 63 with respect to the first rotation axis B.

Going further along the spiral shape of the spring elements 55, 56 from their first end 60, 61, each second arm 72, 73 is connected to a previous first arm 70, 71 via a respective second spring portion 68, 69 extending perpendicular to the first and second arms 70-73, on the same side as the respective anchorage element 62 and 63 with respect to the first rotation axis B.

Finally, going further along the spiral shape of the spring elements 55, 56 starting from their first end 60, 61, the tiltable structure 52 is connected to the spring elements 55, 56 through a first arm 70A, 71A.

As shown in FIG. 4B, each of the first arms 70, 71 carries a respective first piezoelectric band 74 of piezoelectric material. Likewise, each of the second arms 72, 73 carries a respective second piezoelectric band 75 of piezoelectric material. For example, the piezoelectric bands 74, 75 may be a lead zirconate titanate (PZT) ceramic.

As shown in FIG. 4C, each piezoelectric band 74, 75 comprises a stack formed by a first electrode 91, a piezoelectric material layer 92, and a second electrode 93. An insulating layer 90 extends between the stack 91-93 and the arms 70-73. Each piezoelectric band 74, 75 may thus be represented electrically as a capacitor, the first electrode 91 of which is grounded and the second electrode 92 of which biased as described below.

The first piezoelectric bands 74 are electrically connected to a first voltage source 76, and the second piezoelectric bands 75 are electrically connected to a second voltage source 77 via metal connections, represented only schematically.

As shown in FIG. 5, the tiltable structure 52 is formed by an orientable platform 80 suspended from a frame 81 through two torsion springs 82 so as to be rotatable about a second rotation axis A. Rotation of the orientable platform 80 may be controlled via actuation structures 83 of a known type, for example of an electrostatic type, represented only schematically. The orientable platform 80 carries a reflecting surface 85, in a per se known manner.

Figure 6A:
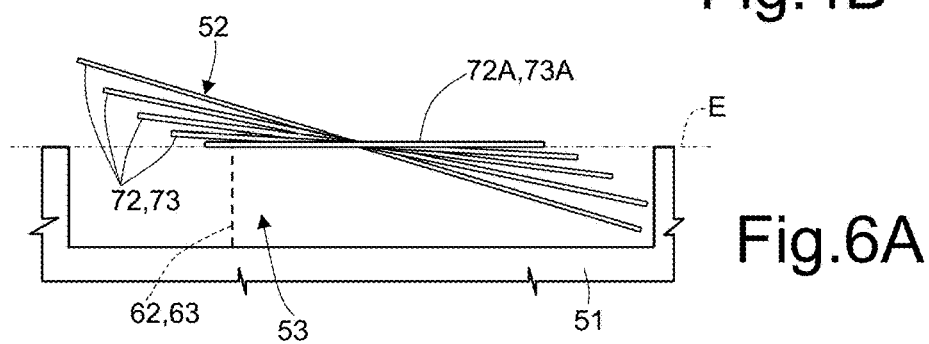
FIG. 6A is a schematic side view of the rotation of the microelectronic micromirror device in a first actuation step.

Due to the described spiral shape, when the piezoelectric bands 74, 75 are not biased, the spring elements 55, 56 and the tiltable structure 52 are coplanar and lie in a resting plane E (FIG. 6A). Further, due to the described spiral structure, each arm 70-73 is virtually anchored to a previous arm of the spiral and, when a respective piezoelectric band 74, 75 is biased, may undergo deformation so as to raise its own end connected to a subsequent arm of the spiral. Consequently, by biasing alternately the first and second arms 70-73, it is possible to control rotation of the tiltable structure 52 in opposite directions, as explained in detail hereinafer.

In use, the voltage sources 76, 77 are driven in phase opposition. In particular, in a first step, an actuation voltage of, for example, 40 V is applied to the first piezoelectric bands 74 by the first source 76 and a voltage of 0 V (ground) is applied to the second piezoelectric bands 75 by the second source 77. As mentioned above, in these conditions, in the first step, the first arms 70, 71 undergo deformation and bend, turning about the first rotation axis B so as to bring their ends connected to the next second arms 72, 73 and the second spring portions 68, 69 into a raised position with respect to the resting plane E (FIG. 6A). In this way, the half of the actuation structure 54 that is located on the same side as the anchorage elements 62, 63 with respect to the first plane of rotation B rotates upwards (out of the cavity 53), as may be seen from FIG. 7. Since the second arms 72, 73 are not biased, they do not undergo deformation, but rotate rigidly.

Figure 7:
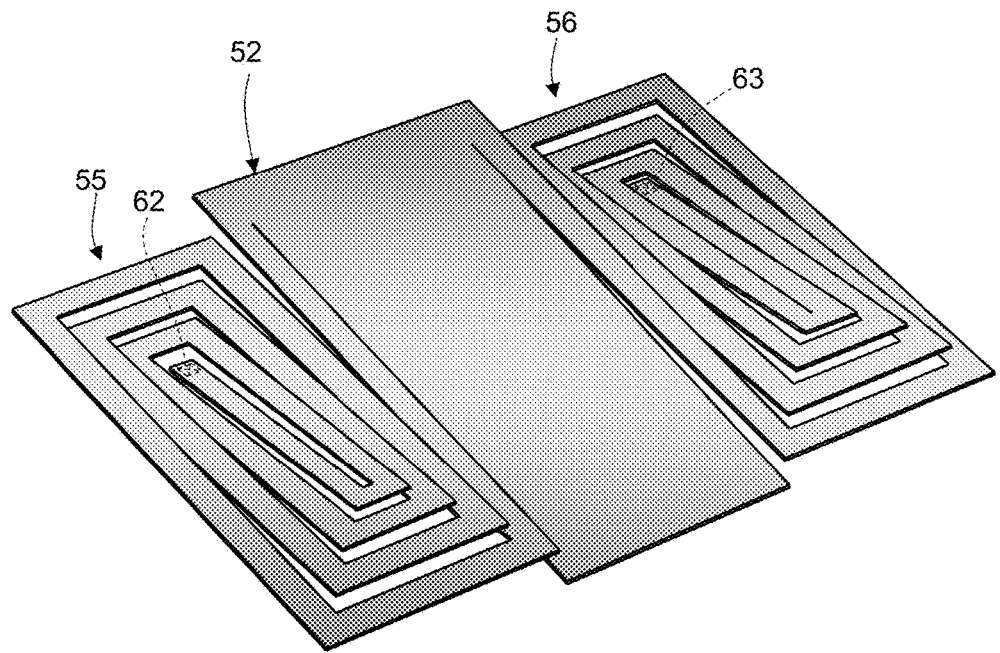
FIG. 7 is a simplified perspective view of the microelectronic device in the first actuation step.

As illustrated in FIGS. 6A, 7, the rotation angle of each of the first arms 70, 71 increases as these are farther away from the anchorage elements 62, 63, until they reach a maximum of 8.2° for the second ends 64, 65. Since the second ends 64, 65 are fixed with respect to the tiltable structure 52, also this rotates through 8.2° in the same direction as the first arms 70, 71.

In a second step (see FIG. 6B), the actuation voltage of, for example, 40 V is applied to the second piezoelectric bands 75 by the second source 77, and the voltage of 0 V (ground) is applied to the first piezoelectric bands 74 by the first source 76. In an opposite way to the above, in this case the second arms 72, 73 bend, turning about the first rotation axis B in an opposite direction to the previous one so as to cause upward rotation (into the cavity 53) of the half of the actuation structure 54 that is located on the side opposite to that of the anchorage elements 62, 63 with respect to the first plane of rotation B.

Figure 6B:
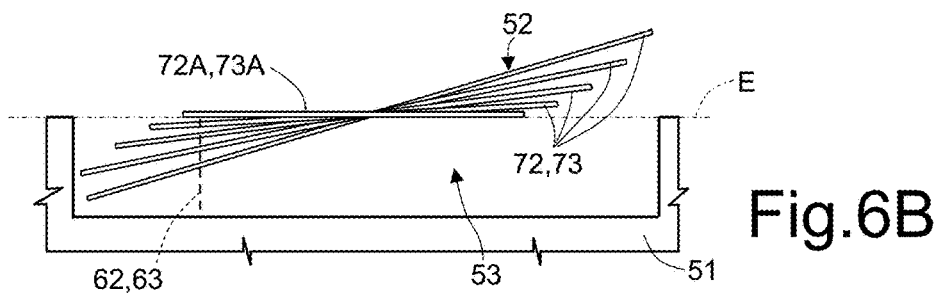
FIG. 6B is a schematic side view of the rotation of the microelectronic micromirror device in a second actuation step.

Also in this case, as illustrated in FIG. 6B, the rotation angle of each of the second arms 72, 73 increases as these are farther away from the anchorage elements 62, 63, up to a maximum of 8.2° for the second ends 64, 65. Since the second ends 64, 65 are fixed with respect to the tiltable structure 52, also this rotates through 8.2° in the same direction as the arms 71, 73.

By controlling the voltage sources 76, 77 alternatively according to a sequence of first and second steps, it is possible to obtain orientation of the tiltable structure 52 and thus of the reflecting surface 85 according to a vertical scan, at 60 Hz.

The microelectronic device 50 may be thus used in a pico-projector 101 designed to be functionally coupled to a portable electronic apparatus 100, as illustrated hereinafter with reference to FIGS. 8-10.

Figure 8:
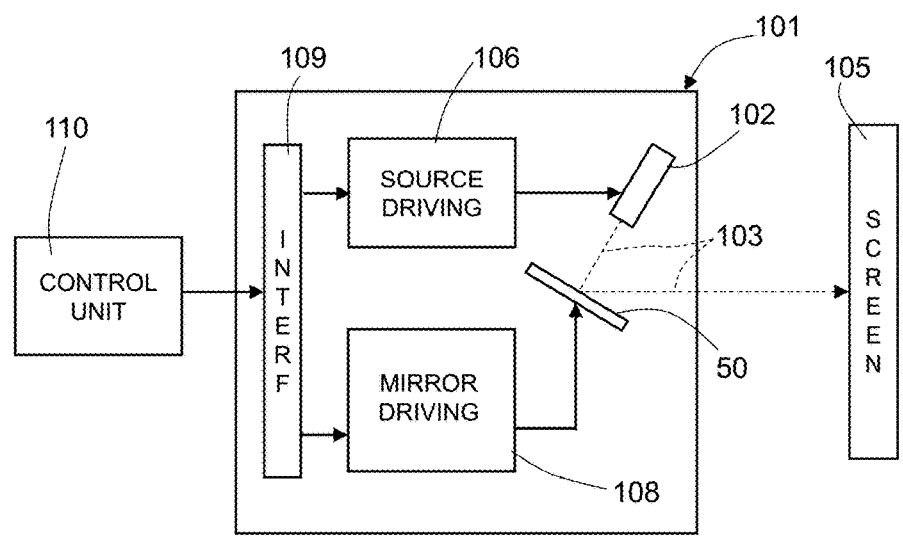
FIG. 8 is a block diagram of a pico-projector using the microelectronic micromirror device.

In detail, the pico-projector 101 of FIG. 8 comprises a light source 102, for example of a laser type, configured to generate a light beam 103; the microelectronic device 50, configured to receive the light beam 103 and to send it towards a screen or display surface 105 (external to, and arranged at a distance from, the pico-projector 101); a first driving circuit 106, configured to supply appropriate control signals to the light source 102, for generating the light beam 103 according to an image to be projected; a second driving circuit 108, configured to supply control signals to the sources 76, 77 (FIG. 4B) of the microelectronic device 50; and a communication interface 109, designed to receive, from an external control unit 110, for example included in the portable apparatus 100 (FIGS. 9 and 10), information on the image to be generated, for example as a pixel array. This information is fed to the light source 102, for driving.

Figure 9:
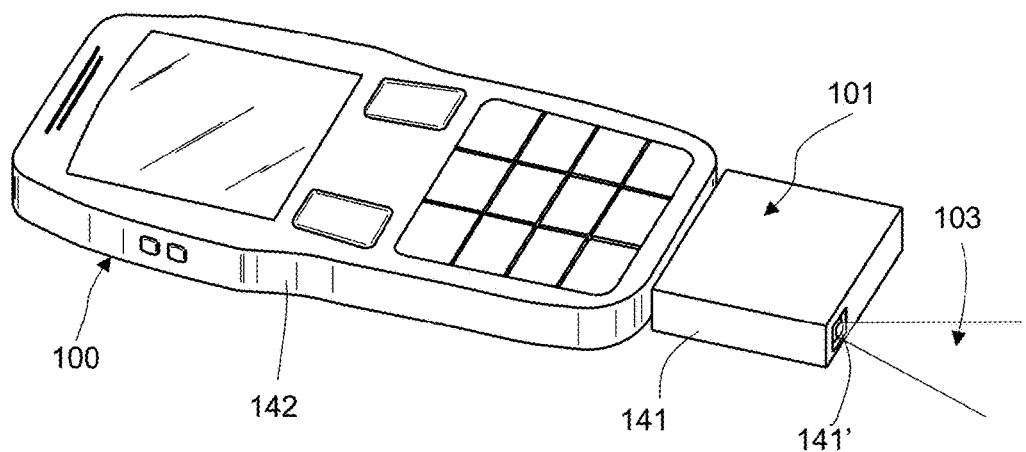
FIGS. 9 and 10 show embodiments of the coupling between the pico-projector of FIG. 8 and a portable electronic apparatus.

The pico-projector 101 may be manufactured as a separate accessory of a stand-alone type with respect to an associated portable electronic apparatus 100, for example a cellphone or smartphone, as shown in FIG. 9. In this case, the pico-projector 101 is coupled to the portable electronic apparatus 100 by appropriate electrical and mechanical connection elements (not illustrated in detail). Here, the pico-projector 101 has an own casing 141, with at least one portion 141' transparent to the light beam 103 coming from the microelectronic device 50. The casing 141 of the pico-projector 1 is coupled in a releasable way to a respective case 142 of the portable electronic apparatus 100.

Figure 10:
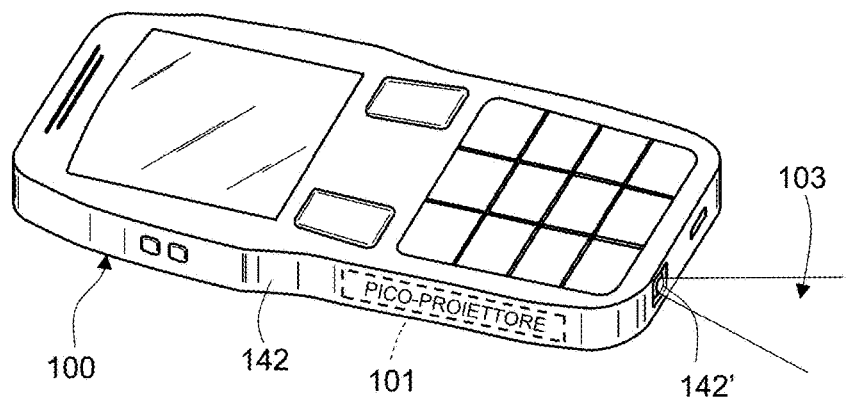

Alternatively, as illustrated in FIG. 10, the pico-projector 101 may be integrated within the portable electronic apparatus 100 and be arranged within the case 142 of the portable electronic apparatus 100. In this case, the portable electronic apparatus 100 has a respective portion 142' transparent to the light beam 103 coming from the microelectronic device 50. The pico-projector 101 is in this case coupled, for example, to a printed-circuit board within the case 142 of the portable electronic apparatus 100.

The microelectronic device 50 described herein has many advantages.

In particular, due to the possibility of using only unipolar voltages of a same type for biasing the piezoelectric bands 74, 75, the piezoelectric material may have a longer service life and a greater stability. In fact, in this way, the piezoelectric material layer 91 of the piezoelectric bands 74, 75 of FIG. 4C sees alternatively a zero voltage and a biasing voltage (here, at 40 V), which do not reverse their sign in any actuation step.

Thereby, the microelectronic device 50 is more reliable.

Finally, it is clear that modifications and variations may be made to the microelectronic device described and illustrated herein, without thereby departing from the scope of the present invention, as defined in the attached claims. For example, instead of having two voltage sources 76, 77, it is possible to use a single source, connected alternately to the first and the second bands 74, 75 through a switch.

The invention claimed is:

1. A micromechanical device, comprising:
a tiltable structure rotatable about a first rotation axis;
a fixed structure; and
an actuation structure of a piezoelectric type coupled between the tiltable structure and the fixed structure,
wherein the actuation structure comprises a spring element having a spiral shape,
wherein the spring element comprises:
a plurality of actuation arms that extend transversely with respect to the first rotation axis, and
a piezoelectric band of piezoelectric material carried on each of said actuation arms.

2. The micromechanical device according to claim 1, wherein the plurality of actuation arms extend parallel to each other and perpendicular to the first rotation axis.

3. The micromechanical device according to claim 1, wherein the plurality of actuation arms are coupled in series with each other between a first end of the spiral shape anchored to the fixed structure and a second end of the spiral shape anchored to the tiltable structure.

4. The micromechanical device according to claim 3, wherein the first end of the spiral shape is an inner end and the second end of the spiral shape is an outer end.

5. The micromechanical device according to claim 1, wherein the spring element has a median plane perpendicular to the first rotation axis, and the plurality of actuation arms include a first set of actuation arms and a second set of actuation arms, the first set of actuation arms being arranged on a first side with respect to the median plane and the second set of actuation arms being arranged on an opposite side with respect to the median plane.

6. The micromechanical device according to claim 5, wherein the piezoelectric bands carried on the actuation arms of the first set of actuation arms are electrically coupled to each other and to a first voltage source, and wherein the piezoelectric bands carried on the actuation arms of the second set of actuation arms are electrically coupled to each other and to a second voltage source.

7. The micromechanical device according to claim 6, wherein the first and second voltage sources are configured to be driven in phase opposition.

8. The micromechanical device according to claim 1, wherein the spring element is a first spring element arranged on a first side of the tiltable structure, the device further comprising a second spring element arranged on an opposite side of the tiltable structure.

9. The micromechanical device according to claim 1, wherein the tiltable structure comprises a suspended platform carried by a frame through an elastic suspension structure configured to enable rotation of the suspended platform about a second rotation axis perpendicular to the first rotation axis.

10. The micromechanical device according to claim 1, wherein the tiltable structure is suspended over a cavity formed in a body of semiconductor material defining the fixed structure, the cavity being delimited by a bottom wall and by a side wall and the spring element being anchored to the bottom wall.

11. The micromechanical device according to claim 1, wherein the tiltable structure comprises a reflecting surface.

12. A pico-projector for use with a portable electronic apparatus, comprising:
a light source configured to generate a light beam as a function of an image to be generated;
a micromechanical device comprising:
a tiltable structure rotatable about a first rotation axis;
a fixed structure; and
an actuation structure of a piezoelectric type coupled between the tiltable structure and the fixed structure,
wherein the actuation structure comprises a spring element having a spiral shape; and a driving circuit configured to supply driving signals to rotate said tiltable structure;
wherein the spring element comprises:
a plurality of actuation arms that extend transversely with respect to the first rotation axis, and
a piezoelectric band of piezoelectric material carried on each of said actuation arms:
wherein said driving signals are applied to the piezoelectric bands on the actuation arms.

13. The pico-projector according to claim 12, wherein the plurality of actuation arms are coupled in series with each other between a first end of the spiral shape anchored to the fixed structure and a second end of the spiral shape anchored to the tiltable structure.

14. The pico-projector according to claim 13, wherein the fixed structure comprises a cavity formed in a body of semiconductor material, the cavity being delimited by a bottom wall and by a side wall and the first end of the spiral shape being anchored to the bottom wall.

15. The pico-projector according to claim 12,
wherein the plurality of actuation arms include a first set of actuation arms and a second set of actuation arms,
wherein the piezoelectric bands carried on the actuation arms of the first set of actuation arms are electrically coupled to each other and to a first voltage source of said driving circuit, and
wherein the piezoelectric bands carried on the actuation arms of the second set of actuation arms are electrically coupled to each other and to a second voltage source of said driving circuit.

16. The pico-projector according to claim 15, wherein the first and second voltage sources are configured to be driven in phase opposition.

17. A method for actuation of a micromechanical device comprising: a tiltable structure rotatable about a first rotation axis; a fixed structure; an actuation structure coupled between the tiltable structure and the fixed structure, the actuation structure comprising a spring element having a spiral shape, the spring element being formed by a plurality of actuation arms extending in transversely to the first rotation axis, each actuation arm carrying a respective piezoelectric band of piezoelectric material, the plurality of actuation arms including a first set of actuation arms and a second set of actuation arms, wherein the piezoelectric bands on the actuation arms of the first set of actuation arms are electrically coupled to each other, wherein the piezoelectric bands on the actuation arms of the second set of actuation arms are electrically coupled to each other, comprising:

applying a first voltage to the piezoelectric bands on the actuation arms of the first set of actuation arms; and applying a second voltage to the piezoelectric bands on the actuation arms of the second set of actuation arms;

wherein the first and second voltages are in phase opposition with respect to each other.

18. The method of claim 17, wherein the first and second voltages have a same sign with respect to the fixed structure.

19. The method of claim 17, wherein the spring element has a median plane perpendicular to the first rotation axis, the first set of actuation arms being arranged on of a first side with respect to the median plane, and the second set of actuation arms being arranged on an opposite side with respect to the median plane.

* * * * *